United States Patent
Schaper et al.

(10) Patent No.: US 7,049,175 B2
(45) Date of Patent: May 23, 2006

(54) METHOD OF PACKAGING RF MEMS

(75) Inventors: Leonard W. Schaper, Fayetteville, AR (US); Ajay P. Malshe, Fayetteville, AR (US); Chad O'Neal, Farmington, AR (US)

(73) Assignee: Board of Trustees of the University of Arkansas, Fayetteville, AR (US)

( * ) Notice: Subject to any disclaimer, the term of this patent is extended or adjusted under 35 U.S.C. 154(b) by 85 days.

(21) Appl. No.: 10/494,956

(22) PCT Filed: Nov. 6, 2002

(86) PCT No.: PCT/US02/35491

§ 371 (c)(1),
(2), (4) Date: May 7, 2004

(87) PCT Pub. No.: WO03/054927

PCT Pub. Date: Jul. 3, 2003

(65) Prior Publication Data

US 2005/0006738 A1    Jan. 13, 2005

Related U.S. Application Data

(60) Provisional application No. 60/331,047, filed on Nov. 7, 2001.

(51) Int. Cl.
*H01L 21/48* (2006.01)

(52) U.S. Cl. .................. 438/113; 438/458; 438/459; 438/460

(58) Field of Classification Search .................. None
See application file for complete search history.

(56) References Cited

U.S. PATENT DOCUMENTS

| | | | |
|---|---|---|---|
| 5,915,168 A * | 6/1999 | Salatino et al. | 438/110 |
| 6,114,191 A * | 9/2000 | Young et al. | 438/125 |
| 6,268,236 B1 | 7/2001 | Miyawaki | 438/106 |
| 6,300,676 B1 | 10/2001 | Kawai | 257/678 |
| 6,365,513 B1 | 4/2002 | Furukawa et al. | 438/667 |
| 6,470,594 B1 | 10/2002 | Boroson et al. | 34/335 |
| 6,559,420 B1 * | 5/2003 | Zarev | 219/209 |
| 6,621,161 B1 | 9/2003 | Miyawaki | 257/723 |
| 6,809,412 B1 * | 10/2004 | Tourino et al. | 257/678 |

* cited by examiner

*Primary Examiner*—Alonzo Chambliss
(74) *Attorney, Agent, or Firm*—Miles & Stockbridge P.C.

(57) ABSTRACT

A structure and process for packaging RF MEMS and other devices employs a substrate of silicon, for example, and a cap of glass, for example, having cavities to receive the devices. MEMS or other devices are supported on an upper surface of the substrate, into which metal-filled blind vias are formed. The cap is attached to the substrate, so as to enclose designated MEMS or other devices in the cavities. The substrate is then thinned so as to expose the metal of the vias at a lower surface of the substrate. Electrical connecting elements such as solder balls are then applied to the metal of the vias. The resultant composite substrate is then divided to provide individual packaged devices.

15 Claims, 1 Drawing Sheet

METHOD OF PACKAGING RF MEMS

This application claims the benefit of Provisional Application No. 60/331,047, filed Nov. 7, 2001

BACKGROUND OF THE INVENTION

This invention is concerned with the packaging of MEMS (Micro Electro Mechanical System) devices and other devices. Typically, MEMS are micromachines that may include elements, sensors, actuators and electronics on a common silicon or other substrate.

MEMS technology is sometimes referred to as the next semiconductor revolution. For scientists and system engineers it brings unique and timely opportunity to integrate various functions such as electrical, optical, fluidic, etc. and is part of next-generation "multi-functional systems (MFS)". MEMS technology has seen a significant surge in the past decade, and MEMS devices are finding applications in many strategic as well as consumer fields. While MEMS technology has progressed rapidly, barriers to packaging, and costs, have hindered widespread realization of MEMS-based systems.

Packaging of MEMS is an area of intense interest for the past few years and will be of greater importance in the years to come. Unlike IC packaging, packaging of MEMS is "application specific". The development of application specific surfaces and interfaces and integration of dissimilar materials for building MEMS integrated system-in-package (SIP) for RF applications, are of particular interest. Frequently, MEMS devices must be packaged in an inert atmosphere or vacuum. Bringing leads out on the top surface of a silicon substrate, for example, creates topography that makes sealing of a cap to the substrate difficult and that makes anodic bonding of a glass cap to the substrate impossible.

SUMMARY OF THE INVENTION

The present invention provides an improved structure and process for packaging RF MEMS and other devices.

An improved package for MEMS and other devices in accordance with the invention can provide, as desired, a physical housing to protect the device, functional interconnects to mechanical systems, avenues for managing by-products like heat and for reducing functional losses like insertion loss of the system, and electrical interfaces to electronic control systems.

In a preferred embodiment of the invention, leads are not brought out on the top surface of a silicon substrate, so that a reliable bond between a glass cap to a smooth silicon substrate can be achieved.

Among the features and advantages of packaging in accordance with the invention are the following:

(1) small electrical interconnection lengths
(2) integration of paper-thin IC chips as a part of a system
(3) wafer scale packages
(4) chip-scale integration of MEMS devices with electrical control platforms
(5) use of traditional processing steps, which makes fabrication manufacturing economical
(6) adaptability to flat/rigid (e.g., ceramic) as well as flexible (e.g., Kapton) substrate carriers.

Furthermore, the invention meets the needs of application specific packaging requirements, which may include the following:

(1) low insertion loss*
(2) high Q factor*
(3) hermetic/vacuum packaging
(4) high material integrity
(5) low temperature processing
(6) integral mechanical strength[1]

[1] *(Note: as a function of frequency)

A packaged RF relay MEMS device in accordance with the invention can provide:

(1) high bandwidth (DC to 20 GHz)
(2) low electrical losses (less than 0.1 dB due to package)

In one embodiment of the invention, MEMS devices are fabricated on an upper surface of a silicon wafer, into which metal-filled blind vias extend. A glass wafer cap is fabricated with cavities to enclose designated MEMS devices. The cavities can be evacuated or filled with an insert gas. The cap is attached to the silicon wafer by electrostatic fusion bonding, for example. In a thinning operation, a substantial portion of the silicon wafer is removed by back-grinding and/or plasma etching to expose the metal of the vias at a lower surface of the silicon substrate, using the glass cap to provide structural integrity and support. Electrical connecting elements are then applied to the exposed metal. The resulting composite wafer structure is then divided into individual packaged devices.

BRIEF DESCRIPTION OF THE DRAWINGS

The invention will be further described in conjunction with the accompanying drawings, which illustrate diagrammatically a preferred (best mode) embodiment, in elevation, and wherein.

DESCRIPTION OF PREFERRED EMBODIMENTS

A preferred embodiment of a structure and process for packaging RF MEMS devices (and other devices) in accordance with the invention will now be described with reference to the drawings.

Figure 1:
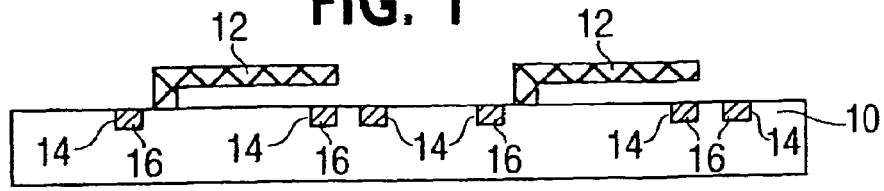
FIG. 1 shows MEMS devices on a silicon wafer having insulated, metal-filled blind vias.

FIG. 1 shows a silicon wafer substrate 10 on which a plurality of MEMS devices 12 (two being shown in the illustration) are fabricated by conventional techniques. Blind vias 14 that extend from an upper surface of the substrate are formed by conventional techniques, and are insulated, as by depositing silicon dioxide (not shown) in the vias by conventional techniques. The vias may extend 100 um into the silicon substrate, for example. At least some of the vias are then filled with a metal 16, such as copper, for example, by conventional plating, for example. Some of the vias can provide electrical connections to the MEMS devices. Other vias can provide photonic or fluidic interfaces, for example. The terms "upper" and "lower" are used herein merely to relate opposite surfaces and are not intended to limit the actual orientation of the surfaces. The term "filled" includes complete or partial filling of the vias sufficient to provide desired electrical conductivity.

Figure 2:
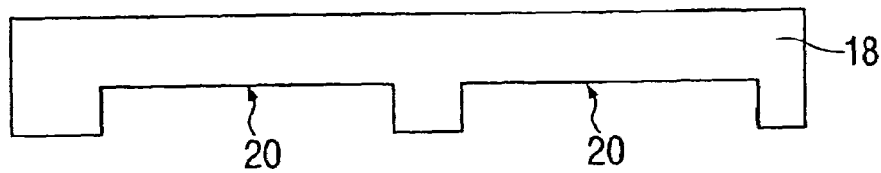
FIG. 2 shows a glass wafer (cap) fabricated with cavities to provide clearance for MEMS devices.
Figure 3:
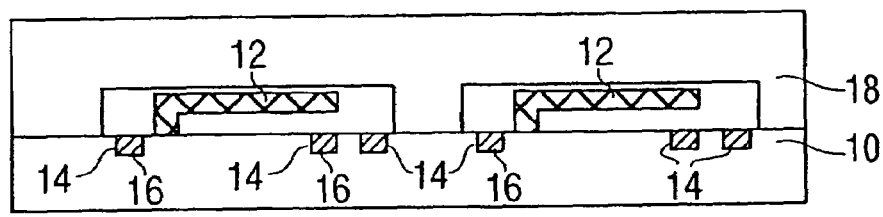
FIG. 3 shows the attachment of the glass wafer to the silicon wafer, with the cavities for the MEMS devices sealed.

A cap, such as a borosilicate glass wafer 18, is etched or otherwise processed to form cavities 20 for the MEMS devices, as shown in FIG. 2. After the glass wafer 18 has been cleaned, the glass wafer and the silicon wafer 10 are aligned and brought into contact as shown in FIG. 3, so that the cavities 20 enclose designated devices 12. Electrostatic fusion bonding or another technique is then used to attach the glass wafer 18 as a cap to the silicon wafer 10. For example, the sandwich of the wafers may be heated to between 250° C. to 450° C. with high voltage applied between the wafers to create an electrostatic bond between the wafers. This process may be carried out in a vacuum chamber or a chamber containing inert gas, so that the sealed cavities including the MEMS devices contain a vacuum or inert gas.

Figure 4:
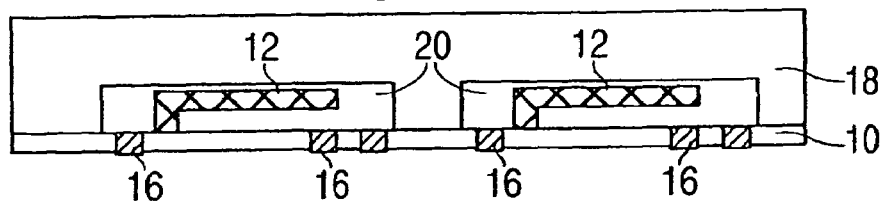
FIG. 4 shows the composite wafer structure of FIG. 3 after back-grinding and/or plasma etching of the silicon to expose the metal of the vias.

As shown in FIG. 4, a substantial lower portion of the silicon substrate 10 is removed in a thinning operation by back-grinding and/or plasma etching, for example, to expose the metal 16 in the vias. At this point, the silicon substrate 10 is substantially thinner than the cap, and structural integrity and support are provided by the glass cap 18. The thinned silicon wafer may have a thickness of 75–100 um, for example. The resultant composite wafer sandwich structure may be cleaned, lapped, and polished with a standard organic agent.

Figure 5:
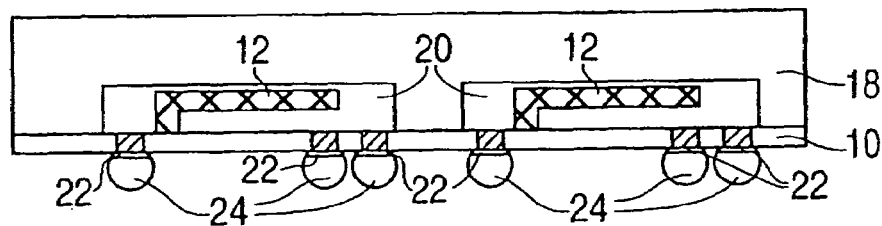
FIG. 5 shows the composite wafer structure of FIG. 4 after application of terminal pad metal and solder balls.

As shown in FIG. 5, electrical connecting elements, such as terminal pad metal 22 and solder balls 24, may be applied to the exposed metal of the vias. The solder balls attached to the vias can act as flip-chip interconnects, for example. The terminal pad metal is used to ensure good adhesion between the metal layers, but its use is optional. An additional insulating layer (not shown) may be provided on the lower surface of the thinned silicon substrate 10 to insulate the terminal pad metal and solder balls from the silicon.

Figure 6:
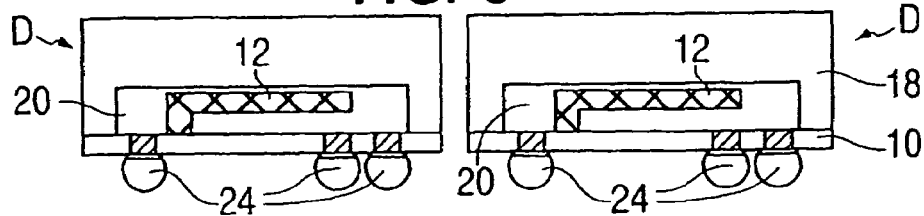
FIG. 6 shows the composite wafer structure of FIG. 5 divided into individual packaged devices.

The composite wafer structure shown in FIG. 5 is then separated into individual dies D (packaged devices), as shown in FIG. 6, as by conventional sawing, for example. Cutting of the composite wafer structure into individual dies can be done with a precision wafer-dicing machine. Spacing between the dies may, for example, be 325 micron for a 100 um saw blade plus an additional 100 micron shoulder space for "crack-free" dicing.

By virtue of the invention, packaging of MEMS or other devices on silicon wafers or other substrates can be achieved economically. Boring of long via through-holes in the substrate is unnecessary, and the processes of attaching a glass or other protective cap to an underlying substrate, and the thinning of the substrate, can be achieved simply by conventional techniques. A large number of individual device packages can be provided by simply dicing a packaged assembly into individual parts. The invention provides economy of scale by making it unnecessary to package individual devices in separate manufacturing operations.

The invention is quite useful for the packaging of MEMS RF relays, mechanical filters, or other MEMS devices fabricated on silicon or other wafers by conventional means, but devices other than MEMS devices can be similarly packaged. Depending upon the needs of a particular application, bonding of the cap to the substrate can be achieved, for example, by anodic bonding, laser bonding, epoxy bonding, etc. For certain applications, such as MEMS RF relays, it is desirable to avoid a bonding technique that may introduce contaminants into the cavities that contain the devices.

As mentioned above, the invention is applicable to the packaging of devices on substrates other than silicon. For example, the invention is applicable to Ti/Au—GaAs based RF MEMS devices, such as RF relays, using a GaAs substrate. The packaging system and process of the invention allow further integration of RF and control circuitry into a GaAs device. The substrate can be a passive substrate or an active substrate that performs functions in connection with the packaged device or with other devices to which the solder balls are connected. The substrate may be multi-layered, and the packaged devices in accordance with the invention can be stacked on similar or different devices, any of which may perform electrical, optical, fluidic, biological or gettering functions, for example. As one example, an RF MEMS package in accordance with the invention can be stacked on and connected to an IC chip.

While preferred embodiments of the invention have been shown and described, it will be apparent to those skilled in the art that these embodiments are merely illustrative of the invention, and that various modifications can be made without departing from the principles and spirit of the invention, the scope of which is defined in the appended claims.

What is claimed is:

1. A process for packaging devices, comprising:
   providing a substrate;
   providing a plurality of devices on a surface of the substrate;
   providing vias extending into the substrate from the surface;
   providing a cap with cavities therein;
   attaching the cap to the substrate so as to enclose devices on the surface in designated cavities of the cap and form a composite structure;
   thinning the substrate to remove a portion thereof away from the surface and in such a manner that the vias are exposed and
   dividing the composite structure to provide separate packaged devices.

2. A process according to claim 1, wherein the substrate is formed of a silicon material and the cap is formed of a glass material.

3. A process according to claim 1, wherein at least some of the vias contain metal.

4. A process according to claim 1, wherein the vias are blind vias.

5. A process according to claim 4, wherein at least some of the vias contain metal that is exposed at locations by the thinning of the substrate, and wherein electrical connecting elements are applied to the exposed metal.

6. A process according to claim 1, wherein the devices provided on the surface of the substrate are MEMS devices.

7. A process according to claim 1, wherein the substrate is formed of a gallium arsenide material.

8. A process according to claim 1, wherein the cap is attached to the substrate by a bonding technique selected from the group of electrostatic fusion bonding, anodic bonding, laser bonding, and epoxy bonding.

9. A process according to claim 1, wherein the thinning employs back-grinding and/or plasma etching.

10. A process according to claim 1, wherein the cavities enclose the devices in a vacuum or inert gas.

11. A plurality of packaged devices, each being provided on a surface of a substrate and enclosed in a cavity of a cap attached to the substrate, and each device having at least one via extending from said surface to an opposite surface of the substrate, said packaged devices being manufactured by the following process:
 providing a substrate with a plurality of said devices on a surface thereof;
 forming a plurality of blind vias that extend into the substrate from the surface;
 providing a cap having a plurality of cavities therein;
 attaching the cap to the substrate so as to enclose the devices in designated cavities of the cap and to form a composite structure;
 removing a portion of the substrate to expose the vias, thereby forming a plurality of conjoined packaged devices; and
 dividing the composite structure so as to separate packaged devices from the composite structure.

12. A plurality of packaged devices manufactured according to the process of claim 11, wherein at least some of the blind vias contain metal to which electrical connecting elements are applied at the locations where the vias are exposed by the removal of the portion of the substrate.

13. A plurality of packaged devices manufactured according to the process of claim 11, wherein the devices are MEMS devices.

14. A plurality of packaged devices manufactured according to the process of claim 11, wherein the cap is attached to the substrate by a bonding technique selected from the group of electrostatic fusion bonding, anodic bonding, laser bonding, and epoxy bonding.

15. A plurality of packaging devices manufactured according to the process of claim 11, wherein the removing of a portion of the substrate employs back-grinding and/or plasma etching.

* * * * *